United States Patent [19]
Khan et al.

[11] Patent Number: 5,146,465
[45] Date of Patent: Sep. 8, 1992

[54] ALUMINUM GALLIUM NITRIDE LASER

[75] Inventors: Muhammad A. Khan, White Bear Lake; James M. VanHove, Eagan; Donald T. Olson, Circle Pines, all of Minn.

[73] Assignee: APA Optics, Inc., Blaine, Minn.

[21] Appl. No.: 649,670

[22] Filed: Feb. 1, 1991

[51] Int. Cl.$^5$ ............................................... H01S 3/19
[52] U.S. Cl. ...................................... 372/45; 372/43; 372/49; 372/99
[58] Field of Search ...................... 372/99, 45, 49, 44, 372/43; 357/17

[56] References Cited

U.S. PATENT DOCUMENTS

| | | | |
|---|---|---|---|
| 4,999,842 | 3/1991 | Huang et al. | 372/99 |
| 5,005,057 | 4/1991 | Izumiya et al. | 357/17 |
| 5,012,486 | 4/1991 | Luryi et al. | 372/99 |
| 5,052,008 | 9/1991 | Kemeny | 372/45 |

OTHER PUBLICATIONS

"Properties of Zn-Doped VPE-Grown GaN. I. Luminescence Data in Relation to Doping Conditions", Monemar et al., Journal of Applied Physics, vol. 51, No. 1, pp. 625-639, Jan. 1980.

"Improvements on the Electrical and Luminescence Properties of Reactive Molecular Beam Epitaxially Grown GaN Films by Using AlN-Coated Sapphire Substrates", S. Yoshida et al., Applied Physics Letters, vol. 42, No. 5, pp. 427-429, Mar. 1, 1983.

"Epitaxial Growth of GaN/AlN Heterostructures", Yoshida et al., Journal of Vacuum Science Technology, pp. 250-253, Apr.-Jun. 1983.

"P-Type Conduction in Mg-Doped GaN Treated with Low-Energy Electron Beam Irradiation (LEEBI)", Amano et al., Japanese Journal of Applied Physics, vol. 28, No. 12 (Dec. 1989), pp. L2112-L2114.

"Stimulated Emission Near Ultraviolet at Room Temperature from a GaN Film Grown on Sapphire by MOVPE Using an AlN Buffer Layer", Japanese Journal of Applied Physics, vol. 29, No. 2, pp. L205-L206, Feb. 1990.

"Photoluminescence Characteristics of AlGaN-GaN-AlGaN Quantum Wells", Kahn et al., Applied Physics Letters, vol. 56, pp. 1257-1259, Mar. 26, 1990.

Primary Examiner—James W. Davie
Attorney, Agent, or Firm—Merchant, Gould, Smith, Edell, Welter & Schmidt

[57] ABSTRACT

An improved aluminum gallium nitride material is disclosed, which permits the fabrication of improved optical devices such as laser mirrors (1, 2), as well as quantum wells and optical filters. The optical devices are constructed by depositing a buffer layer (7) of aluminum nitride onto a substrate (6), with alternating layers (10, 12, 14, etc.) of $Al_xGa_{1-x}N$ and $Al_yGa_{1-y}N$, where x and y have values of between 0 and 1. Edge emitting lasers (31), surface emitting lasers (52) and quantum wells operating in the ultraviolet region are disclosed. The method of the present invention permits the ability to deposit thin, reproducible and abrupt layers of the improved material to permit the construction of rugged, solid state devices operating at ultraviolet wavelengths.

14 Claims, 5 Drawing Sheets

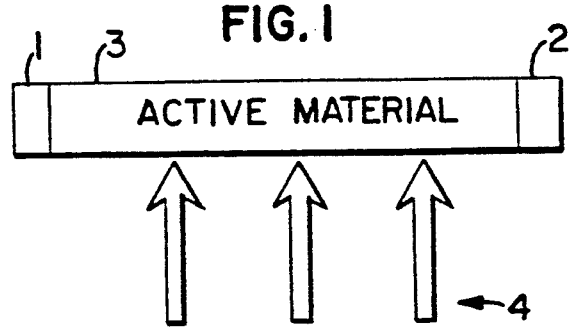
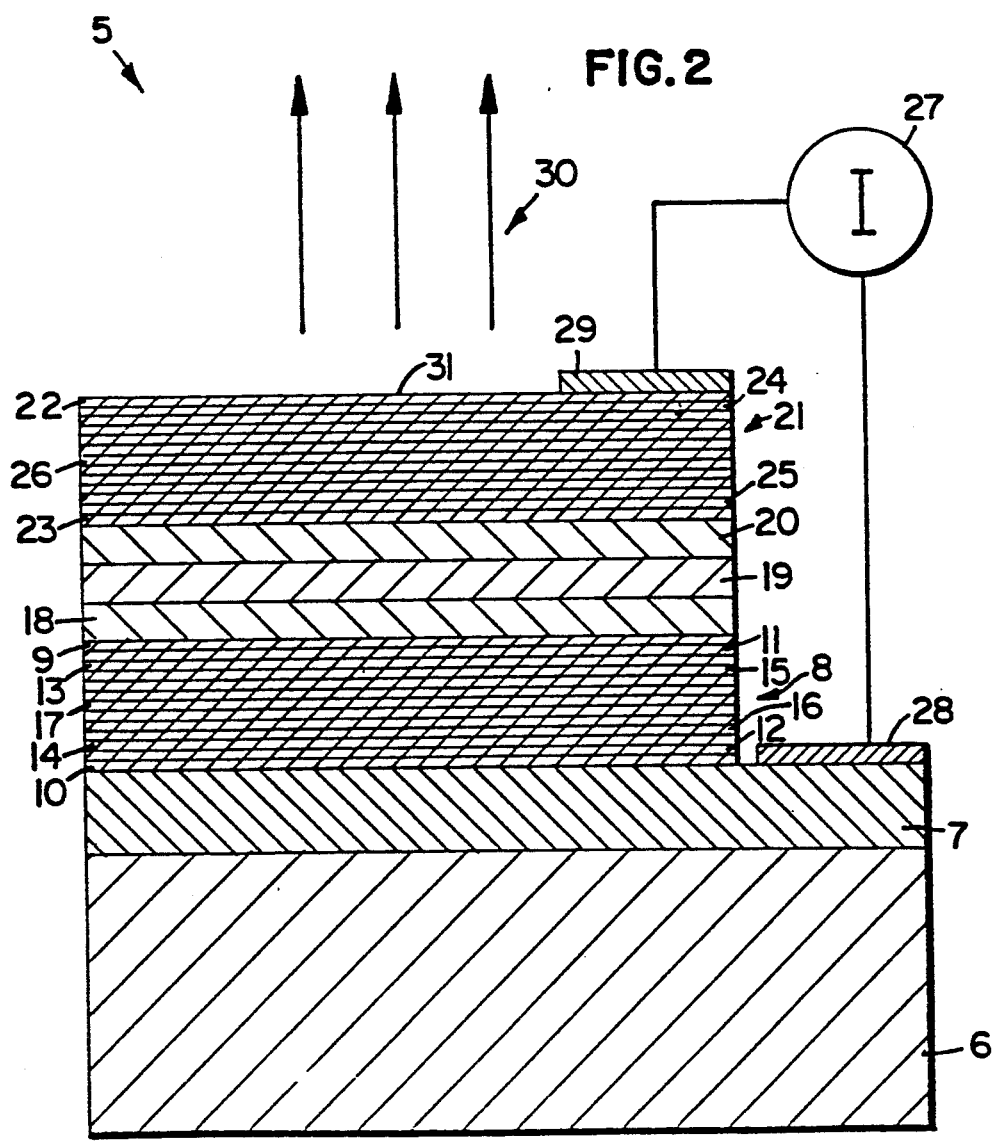

ALUMINUM GALLIUM NITRIDE LASER

1. FIELD OF THE INVENTION

The present invention relates generally to the field of ultraviolet/visible light lasers, and more particularly to surface emitting and edge emitting lasers based on aluminum gallium nitride/gallium nitride heterostructures.

2. DESCRIPTION OF THE RELATED ART

Gallium nitride has long been of interest as a potential material for use in creating light emitting devices, primarily because of its high band gap energy of approximately 3.5 electron volts. Researchers have encountered difficulties in preparing a single crystal gallium nitride material with controlled doping of shallow donors and acceptors. Precise control of growth conditions is critical in order to obtain predictable electrical and optical properties, along with structural characteristics that would permit the resulting material to be incorporated into commercially viable light emitting diodes or lasers.

The introduction of other elements into the gallium nitride material so as to improve its physical, electrical and optical properties has been tried by various researchers. For example, the use of zinc as a dopant material in gallium nitride is described in "Properties of Zinc Doped Vapor Phase Epitaxially Grown Gallium Nitride Luminescence Data in Relation to Doping Conditions" by Monemar, et al, Journal of Applied Physics, Vol. 51, No. 1, pages 625-639, January 1980. Monemar et al reported the use of (0001) oriented sapphire substrates in order to give smoother gallium nitride layers. Layer thicknesses of at least 15-25 micrometers were used to avoid any influence by the substrate on the surface layer of gallium nitride.

The growth of gallium nitride directly on a sapphire substrate results in mechanical strains generated by the lattice mismatch at the gallium nitride/sapphire heteroboundary. In order to address this problem, researchers have coated the sapphire substrate with a thin layer of aluminum nitride, in order to take advantage of a better lattice match between the aluminum nitride and gallium nitride. The successful growth of such crystal films on sapphire substrates was reported, for example, in "Improvements on the Electrical and Luminescence Properties of Reactive Molecular Beam Epitaxially Grown Gallium Nitride Films by using Aluminum Nitride Coated Sapphire Substrates" by S. Yoshida, et al, Applied Physics Letters, Vol. 42, No. 5, pages 427-429, Mar. 1, 1983. The molecular beam epitaxy technique had been used to grow a single crystal film of $Al_xGa_{1-x}N$ as early as 1982.

Specific apparatus and processes for depositing gallium nitride/aluminum nitride layers on a sapphire substrate are reported in "Epitaxial Growth of Gallium Nitride/Aluminum Nitride Heterostructures" by Yoshida et al, Journal of Vacuum Science Technology, pages 250-253, April-June 1983 and "Effects of the Buffer Layer and Metalorganic Vapor Phase Epitaxy of Gallium Nitride on Sapphire Substrate" by Amano, et al, THIN SOLID FILMS, Vol. 163, pages 415-420, 1988. Whereas the former reference utilized molecular beam epitaxy, the latter reference utilized metalorganic vapor phase epitaxy to achieve a gallium nitride film with a smooth surface, free from cracks, on a sapphire substrate.

Another apparatus and method for growing a single crystalline GaN film was reported in "P-Type Conduction in Mg-Doped GaN treated with Low Energy Electron Beam Irradiation (LEEBI)", by Amano, et al., in the Japanese Journal of Applied Physics, Vol. 28, No. 12 (December, 1989), pp. L2112-L2114. Amano, et al, utilized a horizontal type metalorganic vapor phase epitaxy reactor at atmospheric pressure with a trimethylgallium source. The particular residence times of each step in the growth process were not disclosed, however.

The use of Gallium Nitride materials in a light emitting application within the ultraviolet region is reported by Amano, et al, "Stimulated Emissions Near Ultraviolet at Room Temperature from a Gallium Nitride Film Grown on Sapphire by Metalorganic Vapor Phase Epitaxy using an Aluminum Nitride Buffer Layer", Japanese Journal of Applied Physics, Vol. 29, No. 2, pages L205-L206, February 1990. In this Amano, et al reference, the metalorganic vapor phase epitaxy system operated at atmospheric pressure and resulted in a gallium nitride film that is approximately 3 ½ micrometers thick residing on an aluminum nitride interface with a depth of approximately 50 nanometers, the latter residing on a sapphire substrate of approximately 250 micrometers in thickness. This resulted in a gallium nitride film having a carrier concentration of about $2 \times 10^{17}$ per cubic centimeter at room temperature and an electron mobility of approximately 350 square centimeters per volt second at room temperature.

In the Amano paper emissions from GaN were reported. However, no information was given regarding the use of GaN/mirrors, etc., to create an actual laser, rather than a mere light emitter.

Finally, Kahn et al. reported on the photoluminescent characteristics of quantum wells composed of an AlGaN-GaN-AlGaN structure, in *Applied Physics Letters*, Vol. 56, pp. 1257-1259, Mar. 26, 1990. These quantum wells were grown on basal plane sapphire by low pressure metalorganic vapor deposition. The photoluminescence spectrum showed a peak emitted light intensity near the region having a wavelength of approximately 3400 angstroms.

Ideally, the ability to deposit gallium nitride materials in a controllable and precise manner would permit the development of a family of solid state optical devices, such as filters and ultraviolet lasers. Despite the efforts of previous researchers, ultraviolet lasers continue to be physically large and difficult to operate, requiring the use of high purity gasses which must be vented from the laser apparatus and the building housing the laser apparatus.

3. SUMMARY OF THE INVENTION

The present invention resides in an apparatus and method for creating high quality single crystal gallium nitride layers over basal plane sapphire substrates and a family of optical devices fabricated therefrom. A low pressure metalorganic chemical vapor deposition technique is used which results in materials having carrier densities as low as $10^{17}$ per cubic centimeter at room temperature with corresponding electron mobilities of approximately 300 square centimeters per volt second. The photoluminescence line widths are as narrow as three nanometers. Narrow bandwidth filters are created by depositing quarter wavelength laminates, or stacks, of $Al_yGa_{1-y}N/Al_xGa_{1-x}N$, where x and y have values between zero and one. The improved gallium nitride material permits the construction of improved optical devices, including mirrors, quantum wells, and lasers. In particular, the present invention includes a solid state ultraviolet laser, thereby providing an efficient, compact, rugged and lightweight alternative to prior art ultraviolet laser devices.

4. BRIEF DESCRIPTION OF THE DRAWINGS

FIG. 1 is a schematic diagram depicting the essential elements of a laser;

FIG. 2 is a schematic diagram of the surface emitting visible ultraviolet laser utilizing electronic pumping;

5. DESCRIPTION OF THE PREFERRED EMBODIMENTS

Basal plane sapphire substrates having the dimensions of approximately 1.25 centimeters by 1.25 centimeters were used as the deposition surface. The sapphire substrates were degreased, then etched in hot $H_3PO_4$:$H_2SO_4$ and loaded onto a silicon carbide coated graphite susceptor in the reactor chamber. The susceptor was preheated by radio frequency induction heating to 1,050° C. in a hydrogen atmosphere at an ambient pressure of 76 torr.

The column 3 source material was triethylgallium, while the column 5 source material was high purity ammonia. The triethylgallium flux was approximately 3.6 micromoles per minute.

In the case of the first three examples, a thin buffer layer of aluminum nitride (approximately 500 angstroms) was deposited prior to the growth of the gallium nitride layer.

EXAMPLE 1

At a growth temperature of 775° C., the resulting gallium nitride film had a carrier concentration of approximately $1 \times 10^{19}$ per cubic centimeter at 300° Kelvin. The electron mobility was approximately 70 square centimeters per volt second at a range of temperatures varying from 300° Kelvin to 77° Kelvin. The photoluminescence was 20 nanometers at 300° Kelvin with an absolute edge of 15 nanometers. There were no photoluminescent excitonic features at 300° Kelvin.

EXAMPLE 2

At a growth temperature of 875° C., the carrier concentration was approximately $7 \times 10^{17}$ per cubic centimeter at 300° Kelvin. The electron mobility was approximately 110 square centimeters per volt second at 300° Kelvin, 120 square centimeters per volt second at 180° Kelvin, and 65 square centimeters per volt second at 77° Kelvin. The photoluminescence at 300° Kelvin was 10 nanometers, with an absolute edge of 10 nanometers. There were no photoluminescent exitonic features at 300° Kelvin.

EXAMPLE 3

At a growth temperature of 1,050° C., the carrier concentration was approximately $1 \times 10^{17}$ per cubic centimeter at 300° Kelvin. The electron mobility at 300° Kelvin was 350 square centimeters per volt second, at 180° Kelvin the electron mobility was approximately 435 square centimeters per volt second and at 77° Kelvin the electron mobility was approximately 254 square centimeters per volt second. The photoluminescence at 300° Kelvin was approximately 3 nanometers with an absolute edge of approximately 5 nanometers. There were photoluminescent exitonic features at 300° Kelvin.

EXAMPLE 4

Two filters were deposited using a low pressure metalorganic chemical vapor deposition technique. Basal plane sapphire (0001) substrates were prepared for growth using the following procedure:

1. Degreased in propanol for 5 minutes;
2. Nitrogen dry;
3. 10 minute etch in tricky solution at 150° C.;
4. 10 minute acetone flush;
5. 10 minute methanol flush;
6. 15 minute etch in 1:1 sulfuric:phosphoric acid solution at 150° C.;
7. 5 minute Dl water rinse;
8. Rinse and flush with 150° C. propanol;
9. Nitrogen blowoff and chamber load.

Figure 6:
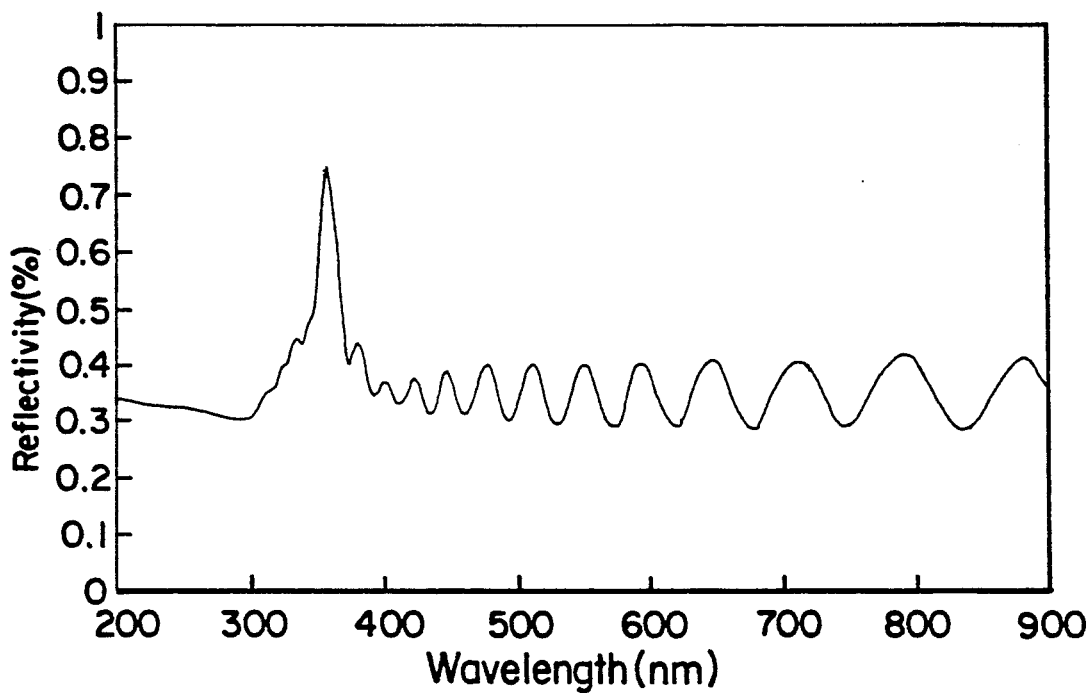
FIG. 6 is a reflectance profile for Sample one as described in Example 4.
Figure 7:
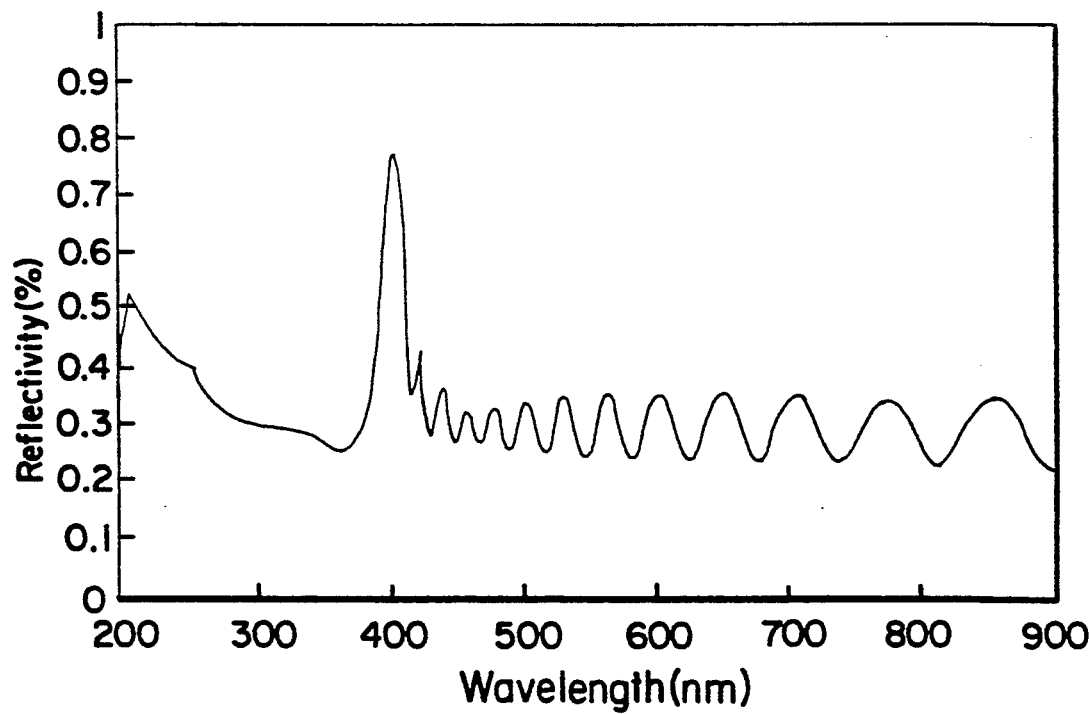
FIG. 7 is a reflectance profile for Sample two as described in Example 4.

Prior to deposition of the filter stack, a thin layer of AlN was used as a buffer layer onto which 0.5 $\mu$m of GaN was deposited. Following the completion of buffer layer growth, individual layers of AlGaN and GaN were deposited in sequence. All growths were terminated with the higher refractive index material on top and thus these structures were terminated with GaN. Following the growth of the last layer, the substrate was cooled to 500° C. under an ammonia flux to prevent column III material sublimation. The sample was then allowed to cool to room temperature under a hydrogen ambient. The thicknesses of the GaN and AlGaN layers were 46.5 nm and 45.2 nm respectively resulting in a center wavelength of 450 nm. Previous growth calibrations for AlGaN and GaN were conducted and were 1.25 and 1.32 A/sec respectively. Hence, the growth times for the AlGaN and GaN layers were 372 and 342 seconds respectively. The growth of the second sample, centered at 400 nm, proceeded identically, only the growth times of the two layers were reduced. Both filter stacks were comprised of 18 periods. The spectrophotometer used to characterize these filters was an IBM model 6420 UV/Vis spectrophotometer. The wavelength range is 200 nm to 900 nm. FIGS. 6 and 7 show the reflectivity results for the two filter designs. Shown is a plot of reflectance vs. wavelength for samples one and two. Sample one has a reflectivity maximum at 405 nm while Sample two's peak is centered at 368 nm. The peak reflectance of Sample one and Sample two is 66% and 78% respectively.

EXAMPLE 5

Quantum wells were also created using the AlGaN-GaN-AlGaN materials. The growth of the GaN and AlGaN layers by LPMOCVD on basal plane sapphire substrates proceeded as follows. The sapphire substrates were degreased, then etched in hot $H_3PO_4:H_2SO_4$ and loaded onto a silicon carbide coated graphite susceptor in the reactor chamber. The susceptor was preheated by rf induction heating to 1050° C. in a hydrogen ambient at 76 Torr. The column three source materials were triethylaluminum (bubbler temperature 18° C.) and triethylgallium (bubbler temperature 10° C.). The column five source material was high-purity $NH_3$, which was injected into the growth chamber through a separate line at 1000 sccm. To initiate growth an AlN buffer layer was deposited at 1000° C. (70 sccm of triethylaluminum). The desired epitaxial layers of GaN or AlGaN were then deposited at 850° C. The aluminum mole fraction x was then controlled by adjusting the flow rate of triethylaluminum (50 sccm for x=0.2; 60 sccm for x=0.25). The growth rates were in the range of 0.1-0.5 μm/h. Growth of the quantum well structures consisted of depositing a 0.2 μm layer of AlGaN followed by the GaN well (100-300 Å) and finally a 0.2 μm AlGaN layer.

The photoluminescence experiments were performed using a Spectra Physics 2035-3.0 argon ion laser (pump wavelength=2750-3050 Å, up to 400 mW) to excite the samples which were cooled in a closed cycle helium refrigerator to 30K. The recombination radiation was collected with UV compatible optics, dispersed in an ISA HR-640 spectrometer with a 2400 grooves/mm grating, and detected with an uncooled RCA 83010E photomultiplier.

Figure 8:
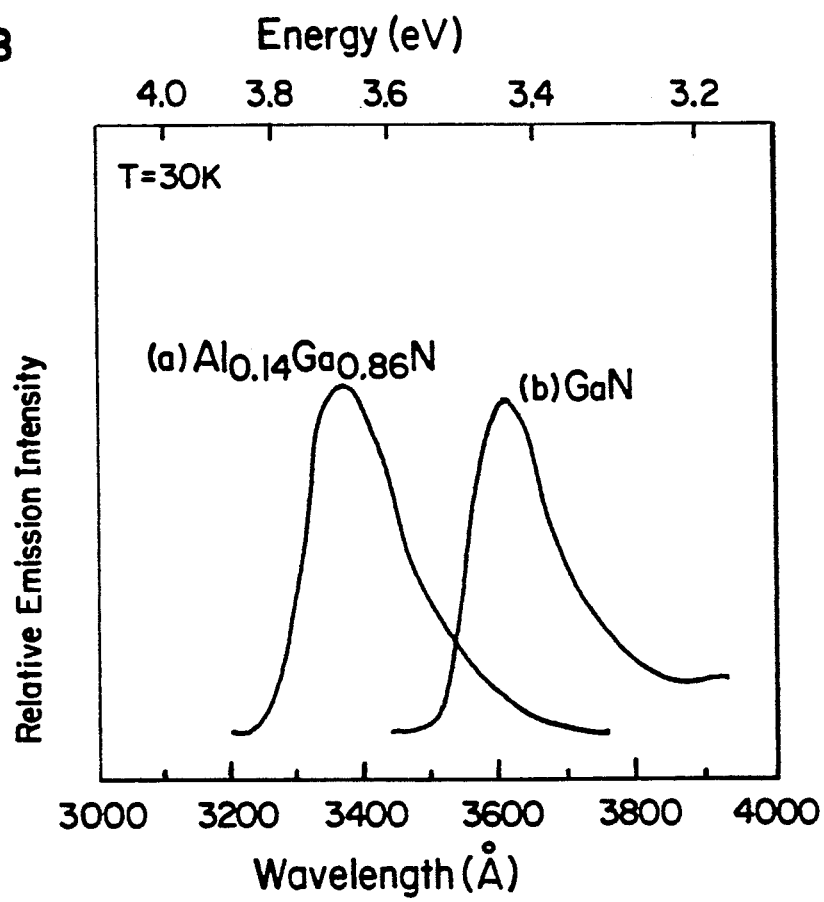
FIG. 8 is a graph depicting the photoluminescence spectrum for bulk GaN and bulk $Al_{0.14}Ga_{0.86}N$ at a temperature of 30° K.

The photoluminescence spectra at 30K from 0.2 μm bulk GaN and $Al_{0.14}Ga_{0.86}N$ are shown in FIG. 8. The peak emission from the GaN occurs at 3600 Å or 3.444 eV and the peak emission from $Al_{0.14}Ga_{0.86}N$ occurs at 3350 Å or 3.70 eV. The choice of 30K was related to the lowest reproducible temperature with the cooling apparatus. Photoluminescence was observed from all the samples (bulk and quantum wells) up to room temperature. Note that the peaks from GaN and AlGaN are distinct and no secondary long-wavelength defect peaks are observed from either sample.

Figure 9:
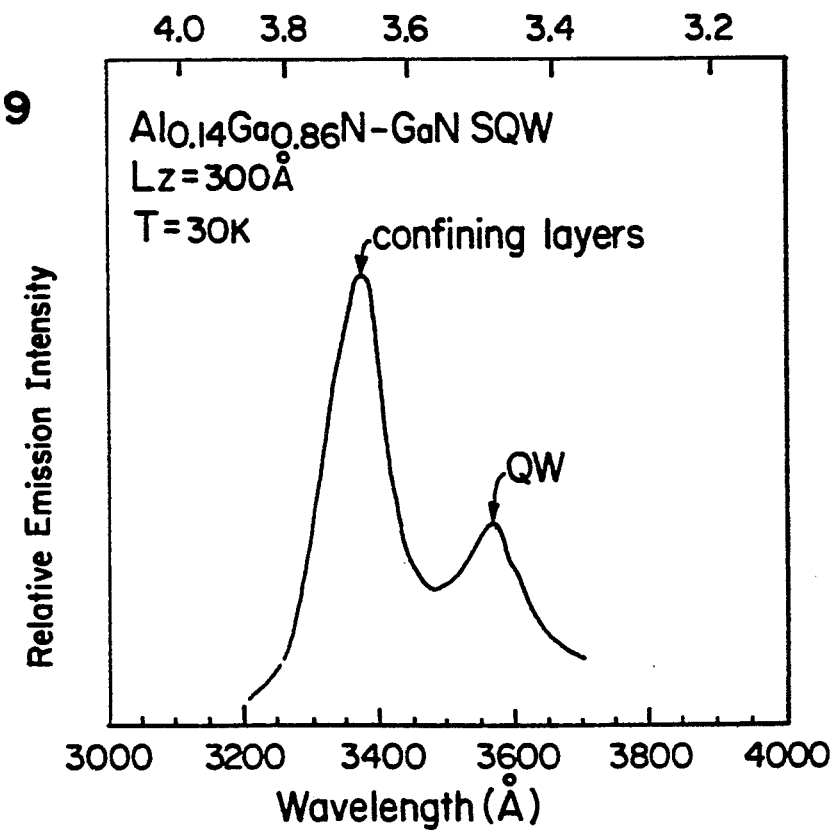
FIG. 9 is a graph depicting the photoluminescence spectrum of a GaN quantum well constructed according to the principles of the present invention.

When a thin GaN layer (100-300 Å) is sandwiched (epitaxially) between two wider band-gap $Al_{0.14}Ga_{0.86}N$ layers the emission from the GaN single quantum well (SQW) is shifted to higher energy (characteristic of type 1 heterojunctions) as shown in FIG. 9. The data in FIG. 9 were obtained from a GaN quantum well whose estimated thickness was 300 Å (growth time, 180 s) with $Al_{0.14}Ga_{0.86}N$ in the confining layers.

Laser Fabrication

The improved quality of the $Al_xGa_{1-x}N$ material system permits the fabrication of surface emitting and edge emitting lasers having improved characteristics, as well as an ability to deposit thin, reproducible and abrupt layers.

Referring to FIG. 1, the essential elements of a visible/ultraviolet light laser constructed with the improved aluminum gallium nitride material can be understood. The laser mirrors 1 and 2 reflect light at the wavelength of laser emission. Sandwiched between the mirrors 1 and 2 is the laser active material 3 which is excited by an energy source 4 which may either electronic, optical or an electron beam. Regardless of the particular laser configuration, the active material can be either a single layer, a heterojunction, a quantum well or a super lattice.

Referring to FIG. 2, a surface emitting visible/ultraviolet laser with electronic pumping for excitation is shown. The surface emitting laser 5 is based on gallium nitride/aluminum gallium nitride PN junctions. The laser is deposited on a substrate 6 having a thickness of approximately 250 micrometers. The substrate may be a variety of materials, such as sapphire, silicon, gallium arsenide, silicon carbide or zinc oxide. A buffer layer 7 is deposited on the substrate 6, the buffer being approximately 50 nanometers in thickness and typically formed of aluminum nitride. The buffer layer 7 facilitates deposition of subsequent layers which may have difficulty bonding directly to substrate 6.

Deposited onto buffer 7 is a series of alternating layers of $Al_xGa_{1-x}N$ and $Al_yGa_{1-y}N$ material. Typically x has a value of approximately 0.2, and y has a value of approximately 0.3. The outer layers 9 and 10 of the mirror 8 are fabricated from the $Al_xGa_{1-x}N$ material, whereas the alternating layers 11 and 12 are formed from the $Al_yGa_{1-y}N$ material. Layers 13 and 14 are therefore made of the $Al_xGa_{1-x}N$ material and layers 15 and 16 alternate to the $Al_yGa_{1-y}N$ material. This alternation of layers continues such that the center layer 17 must necessarily be of the $Al_xGa_{1-x}N$ material. The thickness of the N type mirror 8 corresponds to a quarter wavelength of the desired light emission frequency.

Deposited onto the N type mirror 8 is an N type spacer 18, having a thickness of approximately 5 micrometers and being constructed of an $Al_zGa_{1-z}N$ material, where z is approximately 0.4.

The active region 19 of laser 5 abuts N type spacer 18, and is composed of either an $Al_xGa_{1-x}N$ material or a quantum well constructed of $Al_xGa_{1-x}N/GaN/Al_xGa_{1-x}N$. The thickness of the active region 19 is approximately 300 angstroms.

The next layer to be deposited onto the active region 19 is a P-type spacer 20, composed of an $Al_zGa_{1-z}N$ material, and having a thickness of approximately 250 angstroms. The combined thickness of layers 18, 19 and 20 should correspond to a half wavelength of the desired light emission frequency. The next layer 21 is a P-type mirror which is substantially identical to N type mirror 8, and insofar as the outer layers 22 and 23 are composed of an $Al_xGa_{1-x}N$ material, with alternating layers, such as layers 24 and 25, composed of an $Al_yGa_{1-y}N$ material. The center layer 26 is necessarily composed of $Al_xGa_{1-x}N$ material. P-type mirror 21 is a quarter wave stack having a thickness corresponding to a quarter wavelength of the desired light emission frequency. Excitation, or population inversion, of the laser is accomplished by current source 27 which is connected to buffer layer 7 through N-type ohmic contact 28, the circuit being completed through P-type ohmic contact 29 which is affixed to layer 22 of P-type mirror 21. Light 30 is emitted from surface 31 of layer 22 of P-type mirror 21.

Figure 3:
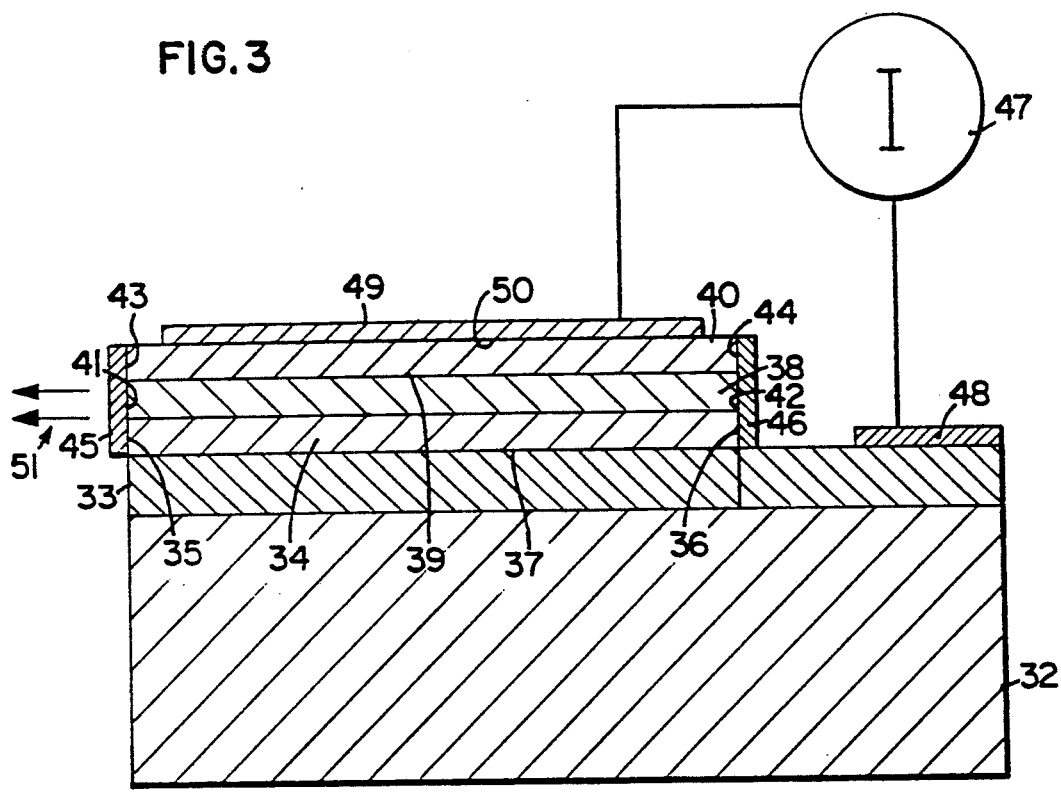
FIG. 3 is a schematic view of an edge emitting visible ultraviolet laser utilizing an electronic pump.

Referring to FIG. 3, an edge emitting laser 31 is disclosed. The laser resides on substrate 32 which is approximately 250 micrometers thick and may be constructed of sapphire, silicon, gallium arsenite, silicon carbide or zinc oxide. An aluminum nitride buffer layer 33 approximately 50 nanometers thick is deposited onto substrate 32. An N-type layer 34, having a thickness of approximately 4 micrometers, is deposited onto buffer layer 33 and is composed of an $Al_xGa_{1-x}N$ material, where x is equal to approximately 0.14. The N-type layer 34 has a first edge 35 and a second edge 36.

Deposited onto top layer 37 of N-type layer 34 is the laser active region, which is of an N-type material such as $Al_yGa_{1-y}N$ or $Al_yGA_{1-y}N/GaN/Al_yGa_{1-y}N$ quantum wells. The active region 38 is approximately 300 angstroms in thickness.

Deposited onto top layer 39 of active region 38 is a P-type layer 40 composed of $Al_xGa_{1-x}N$ material, having a thickness of approximately 4 micrometers.

The active region 38 has a first edge 41 and a second edge 42, whereas P-type layer 40 has a first edge 43 and a second edge 44.

A first laser mirror 45, approximately 2 micrometers thick, abuts edges 35, 41 and 43, while a second laser mirror 46 is deposited onto edges 36, 42 and 44 of the N-type layer/active region/P-type layer stack. The laser mirrors 45, 46 are constructed of multiple layers of $Al_yGa_{1-y}N/Al_xGa_{1-x}N$ or dielectric multilayers, dielectric/metal multilayers to which dielectric reflective coatings have been added. The laser is excited by means of current source 47 which is electrically connected through N-type ohmic contact 48 which resides on buffer layer 33, the circuit being completed through P-type ohmic contact 49 which resides on top surface 50 of P-type layer 40. Laser emission 51 occurs through mirrors 45, 46.

Figure 4:
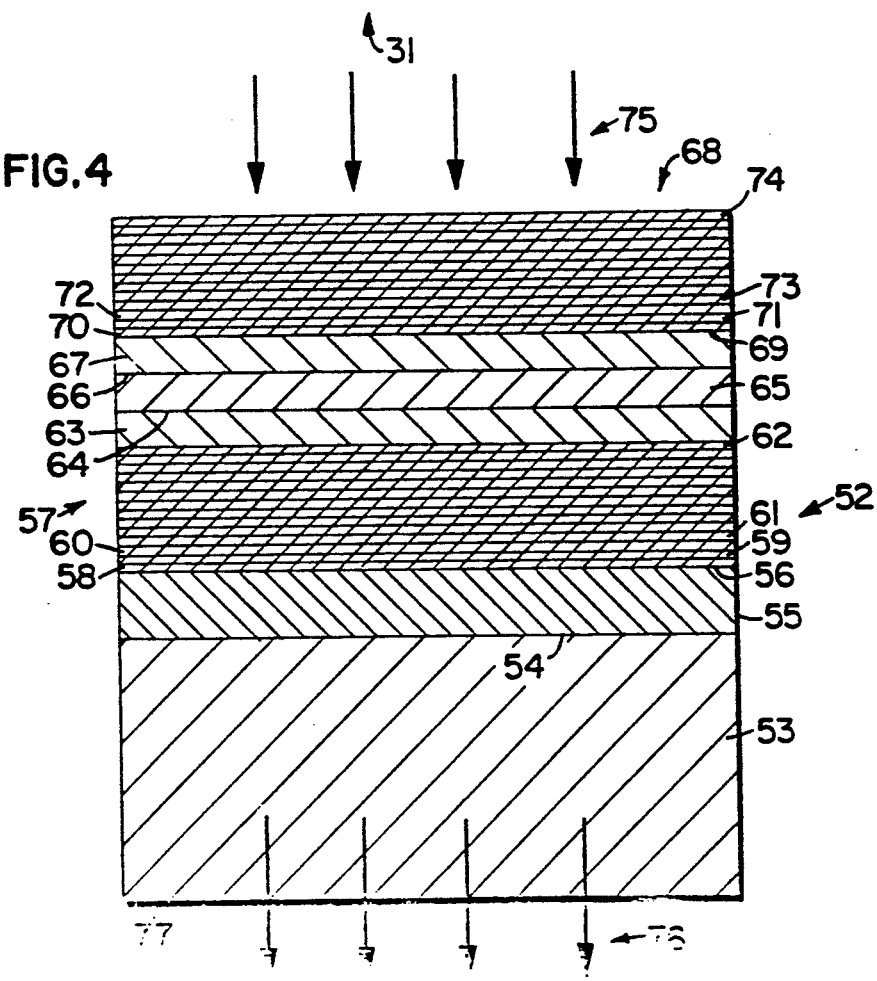
FIG. 4 is a surface emitting visible/ultraviolet light laser with electron beam or optical pumping.

Another embodiment of the present invention is shown in FIG. 4, which depicts a surface emitting visible/ultraviolet light laser 52 which is excited with electron beam or optical pumping. The laser 52 is formed on a substrate 53, having a thickness of approximately 250 micrometers which is formed of either sapphire, silicon, gallium arsenide, silicon carbide or zinc oxide. Deposited on inner surface 54 of substrate 53 is a buffer material 55, having a thickness of approximately 50 nanometers. The buffer layer 55 is typically formed of aluminum nitride.

Deposited onto outer surface 56 of buffer layer 55 is an N-type mirror 57. The N-type mirrors formed in a manner substantially identical to that as described for the embodiment of FIG. 2, namely having alternating layers, for example, layers 58, 59, 60, 61, with layers 58 and 60 being formed of an $Al_xGa_{1-x}N$ material, and layers 59 and 61 being formed of an $Al_yGa_{1-y}N$ material, and layers 59 and 61 being formed of an $Al_yGa_{1-y}N$ material where x can have any value between 0 and 1, and similarly can have any value between 0 and 1. Outer layer 62 would necessarily be fabricated of an $Al_xGa_{1-x}N$ material.

Deposited onto layer 62 is an N-type spacer 63 which is formed of an $Al_zGa_{1-z}N$ material, where z may have any value between 0 and 1. Deposited onto outer surface 64 of spacer 63 is the laser active region 65, having a thickness of approximately 100 micrometers and being formed of either an $Al_xGa_{1-x}N$ material or an $Al_xGa_{1-x}N/GaN/Al_xGa_{1-x}N$ quantum well.

Deposited onto surface 66 of active region 65 is P-type spacer 67 which is formed of an $Al_zGa_{1-z}N$ material. The thickness of layers 63, 65 and 67 should equal one half wavelength of the desired light emission frequency.

Finally, the P-type mirror 68 is deposited onto surface 69 of P-type spacer 67. The P-type mirror 68 is formed in a substantially identical manner to the P-type mirror 21 as described with reference to the embodiment of FIG. 2. In other words, a series of alternating layers, for example, 70, 71, 72 and 73 are deposited sequentially with layers 70 and 72 being formed of an $Al_xGa_{1-x}N$ material while layers 71 and 73 are formed of an $Al_yGa_{1-y}N$ type material. Outer layer 74 is necessarily composed of an $Al_xGa_{1-x}N$ material.

The laser 52 is excited by electron beam or optical pumping source 75 causing the emission of light 76 through outer surface 77 of substrate 53.

Figure 5:
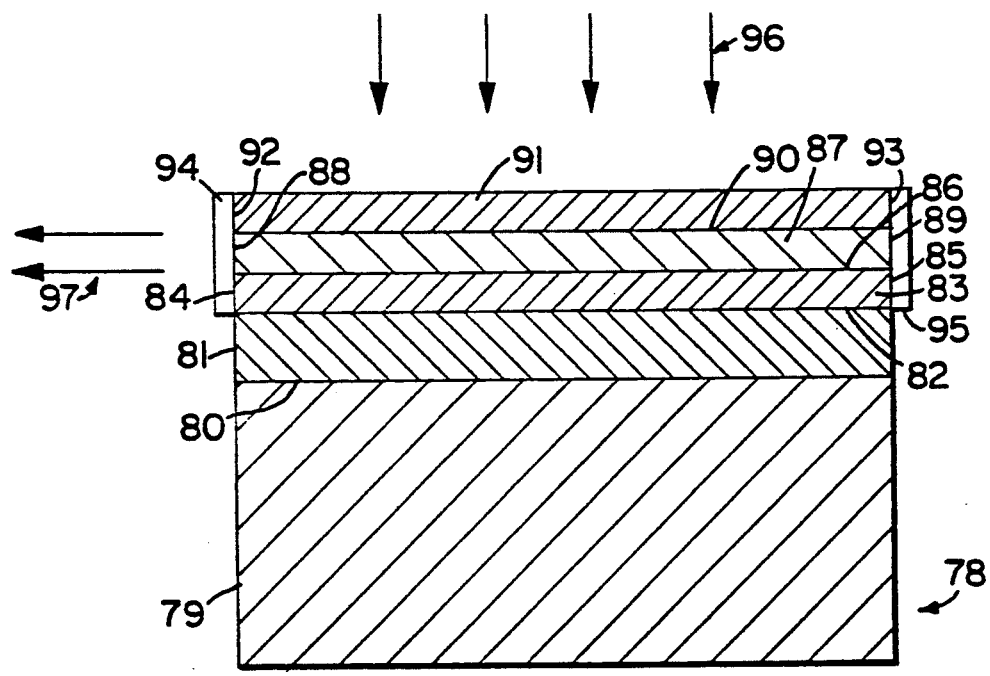
FIG. 5 is an edge emitting visible/ultraviolet light laser with electronic beam or optical pumping.

Referring to FIG. 5, an alternate embodiment of the present invention is shown in the form of an edge emitting visible/ultraviolet laser with electron beam or optical pumping for excitation of the laser active region. The edge emitting laser 78 is fabricated on a substrate 79, having a thickness of approximately 250 micrometers and being formed of either sapphire, silicon, gallium arsenide, silicon carbide or zinc oxide. Deposited on upper surface 80 of substrate 79 is buffer layer 81, which is typically composed of aluminum nitride and has a thickness of approximately 50 nanometers. Deposited on surface 82 of buffer layer 81 is an N-type layer composed of $Al_xGa_{1-x}N$, where x can assume any value between 0 and 1. N-type layer 83 typically has a thickness of approximately 4 micrometers, and has a first edge surface 84 and a second edge surface 85.

Deposited on surface 86 of N-type layer 83 is the laser active region 87, which is typically approximately 5 micrometers in thickness, and has a first edge 88 and a second edge 89. The laser active region 87 is typically conducted of N-type $Al_yGa_{1-y}N$ or $Al_yGa_{1-y}N/GaN/Al_yGa_{1-y}N$ quantum wells.

Deposited on surface 90 of laser active region 87 is a P-type layer 91, approximately 5 micrometers thick, and being composed substantially of $Al_xGa_{1-x}N$. The P-type layer 91 has a first edge 92 and a second edge 93.

A first cavity mirror 94 abuts edges 92, 88 and 84 of the laser laminate, being formed by polishing the cavity and applying dielectric reflective coatings. The materials used are typically $Al_yGa_{1-y}N/Al_xGa_{1-x}N$ and multilayers were dielectric multilayers, or either dielectric multilayers or dielectric/metal multilayers. A substantially identical cavity mirror 95 abuts edges 93, 89 and 85 of the laser laminent.

The laser is excited by electron beam or optical pumping source 96 which causes a laser emission 97 to emerge from mirrors 94, 95.

Those skilled in the art will appreciate that the foregoing Examples and descriptions of various preferred embodiments of the present invention are merely illustrative of the invention as a whole, and that variations in implementation of the present invention are still within the spirit and scope of the invention as defined by the following claims.

We claim:

1. A visible/ultraviolet light laser comprising:
   (a) a first mirror;
   (b) a second mirror; and
   (c) an active region, the active region having a first surface and a second surface, said first surface abutting said first mirror and said second surface abutting said second mirror;

wherein said first mirror, said second mirror and said active region are composed substantially of an aluminum gallium nitride material.

2. The laser of claim 1, wherein the first mirror has a first outer layer and a second outer layer, said first and second outer layers being composed substantially of $Al_xGa_{1-x}N$, where x has a value of between 0 and 1.

3. The laser of claim 2, wherein said first mirror further comprises:
   (a) a first material, said first material being composed substantially of $Al_xGa_{1-x}N$; and
   (b) a second material, said second material being composed substantially of $Al_yGa_{1-y}N$;

where x and y have values of between 0 and 1, said first material and said second material being arranged in alternating layers.

4. The laser of claim 3, wherein said first material is formed as a substantially planar sheet, and said second material is formed as a substantially planar sheet, said first mirror being formed by alternating layers of said first material and said second material, thereby creating a laminate structure having a thickness, said thickness being approximately equal to one-quarter wavelength of a desired light emission frequency.

5. The laser of claim 4, wherein said laser further comprises:
 (a) a substrate; and
 (b) a buffer layer, said buffer layer being deposited onto said substrate, said first mirror being deposited onto said buffer layer, said active region being deposited onto said first mirror, and said second mirror being deposited onto the active region.

6. The laser of claim 5, wherein said substrate has a thickness of between approximately 200 and 300 micrometers, said substrate being chosen from the group of materials including sapphire, silicon, gallium arsenide, silicon carbide, and zinc oxide.

7. The laser of claim 6, wherein said buffer layer is formed of aluminum nitride, and has a thickness of between approximately 25 and 75 nanometers.

8. The laser of claim 7, wherein x has a value of between approximately 0.1 and 0.3, and y has a value of between approximately 0.2 and 0.4.

9. The laser of claim 8, wherein said active region comprises:
 (a) an N-type spacer layer;
 (b) a P-type spacer layer; and
 (c) an active material layer, said active material layer residing between said N-type spacer and said P-type spacer, said P-type spacer abutting said first mirror, and said N-type spacer abutting said second mirror.

10. The laser of claim 9 wherein said active material is composed substantially of $Al_xGa_{1-x}N$.

11. The laser of claim 9, wherein said active material is a quantum well comprising:
 (a) a first layer of $Al_xGa_{1-x}N$;
 (b) a second abutting layer composed of gallium nitride; and
 (c) a third layer, said third layer abutting said gallium nitride layer, said third layer being composed substantially of $Al_xGa_{1-x}N$, where x has a value of between 0 and 1.

12. The laser of claim 11 wherein said active material is formed as a layer having a thickness, said thickness of said layer being between approximately 200 and 400 angstroms.

13. The laser of claim 12, wherein said P-type spacer is composed substantially of $Al_zGa_{1-z}N$ material, where z has a value of between 0 and 1.

14. The laser of claim 13, wherein said P layer, said active material and said N layer form a laminate structure, said laminate structure having a thickness substantially equal to one-half wavelength of a desired light emission frequency.

* * * * *